United States Patent
Frederick et al.

(10) Patent No.: US 6,700,797 B2
(45) Date of Patent: Mar. 2, 2004

(54) NESTED PLUG-IN MODULES

(75) Inventors: Steven F. Frederick, Jamison, PA (US); Kimberley A. Smedley, West Chester, PA (US); Ronald L. Gebhardt, Jr., Delran, NJ (US); Douglas A. Tenney, Audubon, PA (US)

(73) Assignee: General Instrument Corporation, Horsham, PA (US)

( * ) Notice: Subject to any disclaimer, the term of this patent is extended or adjusted under 35 U.S.C. 154(b) by 0 days.

(21) Appl. No.: 09/981,210

(22) Filed: Oct. 17, 2001

(65) Prior Publication Data

US 2002/0064034 A1 May 30, 2002

Related U.S. Application Data

(60) Provisional application No. 60/253,777, filed on Nov. 29, 2000.

(51) Int. Cl.[7] ................................................. H05K 7/14
(52) U.S. Cl. ................ 361/797; 361/752; 361/715; 361/796; 439/668; 439/61; 257/99
(58) Field of Search ................ 361/797, 752, 361/724, 714, 816, 800, 796, 715; 439/668, 924.1, 61; 257/99; 174/35 R, 51 R

(56) References Cited

U.S. PATENT DOCUMENTS

| | | | | |
|---|---|---|---|---|
| 4,768,961 A | * | 9/1988 | Lau .......................... | 361/800 |
| 4,840,568 A | * | 6/1989 | Burroughs et al. ......... | 361/801 |
| 5,127,851 A | * | 7/1992 | Hilbert et al. .............. | 361/683 |
| 5,249,979 A | * | 10/1993 | Deinhardt et al. .......... | 361/729 |
| 6,241,562 B1 | * | 6/2001 | Benda et al. ............... | 439/731 |
| 6,317,334 B1 | * | 11/2001 | Abruzzini et al. .......... | 361/685 |
| 6,498,732 B2 | * | 12/2002 | Sucharczuk et al. ....... | 361/796 |

* cited by examiner

*Primary Examiner*—David Martin
*Assistant Examiner*—Hung Bui
(74) *Attorney, Agent, or Firm*—Volpe and Koenig, P.C.

(57) ABSTRACT

A modular electronic chassis system with nested electronic plug-in modules including at least one circuit board providing a first-module-receiving-location and a second-module-receiving-location such that the system is capable of supporting modules in a nested configuration having increased packaging density. A first plug-in module detachably engaged with the first-module-receiving-location. A second plug-in module detachably engaged with the second-module-receiving-location so that the first plug-in module and the second plug-in module are nested.

25 Claims, 12 Drawing Sheets

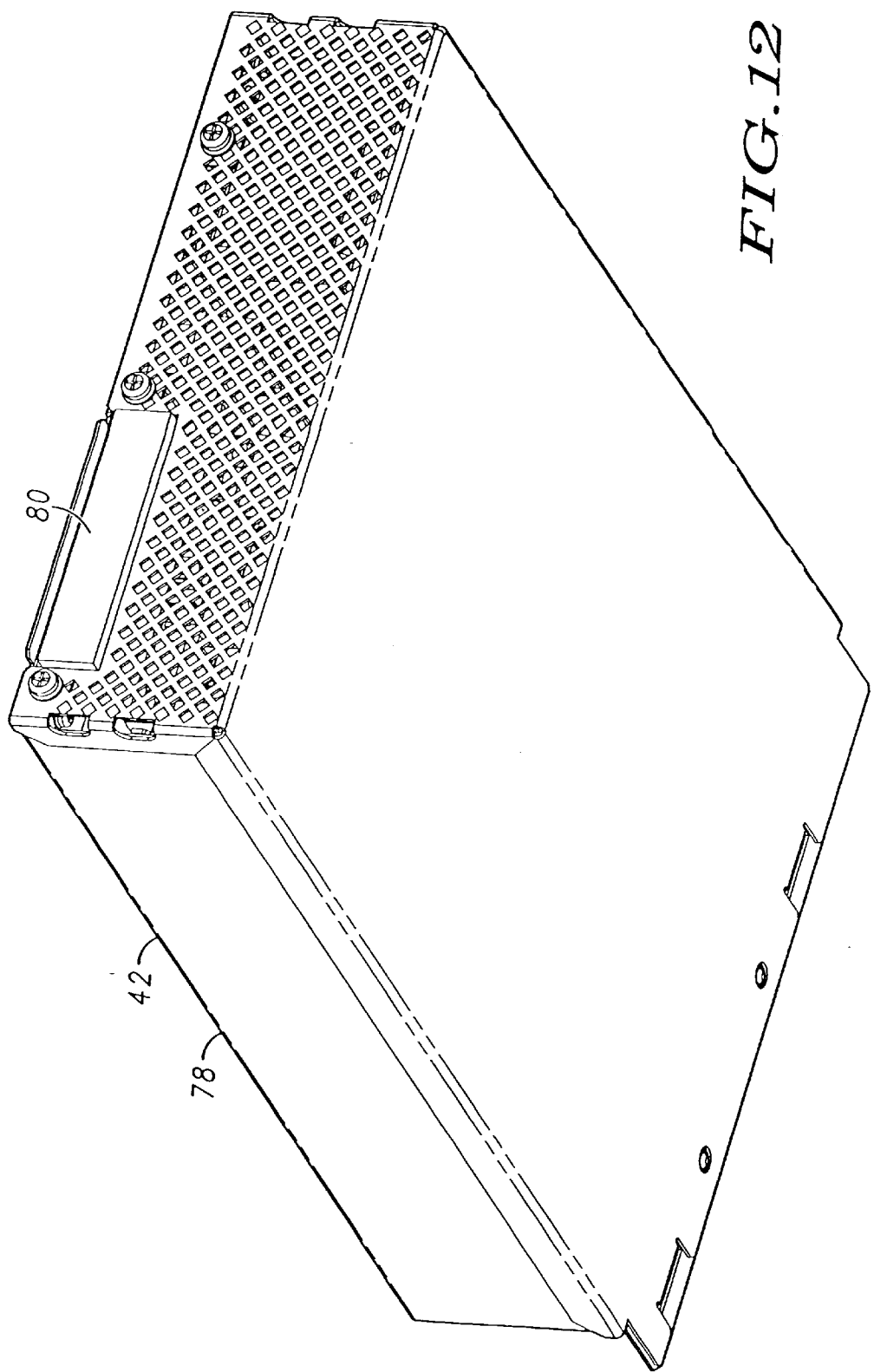

NESTED PLUG-IN MODULES

CROSS-REFERENCE TO RELATED APPLICATION

This application claims the benefit of U.S. Provisional Patent Application No. 60/253,777, filed Nov. 29, 2000, entitled "Modular Electronic Chassis/Backplane Configuration Having Nested Modules for Increased Packaging Density" which is hereby incorporated by reference herein in its entirety.

BACKGROUND

The present invention is generally directed to rack-mounted electronic modules and, more specifically, to an electronic chassis having nested plug-in modules and a backplane capable of use with the plug-in modules.

Plug-in modules are typically positioned side by side and each engages a common vertically oriented planar backplane. Conventional modules typically have a rectangular box shape with a backplane connector mounted thereon. Such modules usually slide into the electronic chassis through a front opening. In some cases, conventional modules are inserted into the electronic chassis on both sides of the backplane to mount the modules in a back-to-back fashion. Such mounting requires that the chassis depth be increased in order to properly contain and/or enclose the back-to-back modules. Some components contained in conventional modules do not require the full volume provided by their respective module housing which results in wasted space in the interior of the electronic chassis.

Additionally, conventional backplanes used in an electronic chassis only receive one size module so that using a smaller sized module to avoid wasted space inside the module housing will result in wasted space inside the interior of the electronic chassis containing the smaller sized module, unless the backplane is positioned off center within the module housing.

Conventional backplanes that receive modules on both major surfaces use an array of straight pins that extend through the backplane. Once the pins are arranged through the backplane, plastic headers are inserted over the pins on both sides of the backplane to form a double ended connector. This results in the type of connector used on one side of backplane dictating the type of connector that exists on the opposite side of the backplane and requires that the opposing connectors share a common axis. This restricts the types of modules that can be attached opposite from each other on both sides of the backplane.

What is needed, but so far has not been provided by the conventional art, are plug-in modules that can be nested to improve packing efficiency within an electronic chassis. Also needed, but so far not provided by the conventional art, is a backplane that can optionally be used with nested plug-in modules, that is capable of use in multiple positions to increase the variety of plug-in modules that can be used with the backplane, that can be used in an electronic chassis that receives plug-in modules in a back-to-back fashion, that allows different types of connectors to be positioned oppositely on both sides of the backplane, that can have connectors positioned generally oppositely on both sides of the backplane without sharing a common axis, and that allows for an improved packing efficiency within the interior of the electronic chassis.

BRIEF DESCRIPTION OF THE DRAWINGS

The present invention will hereinafter be described in conjunction with the appended drawing figures, wherein like numerals denote like elements, and:

FIG. 12 is a rear perspective view of the second plug-in module shown in FIG. 10.

DETAILED DESCRIPTION OF THE PREFERRED EMBODIMENT(S)

Figure 1:
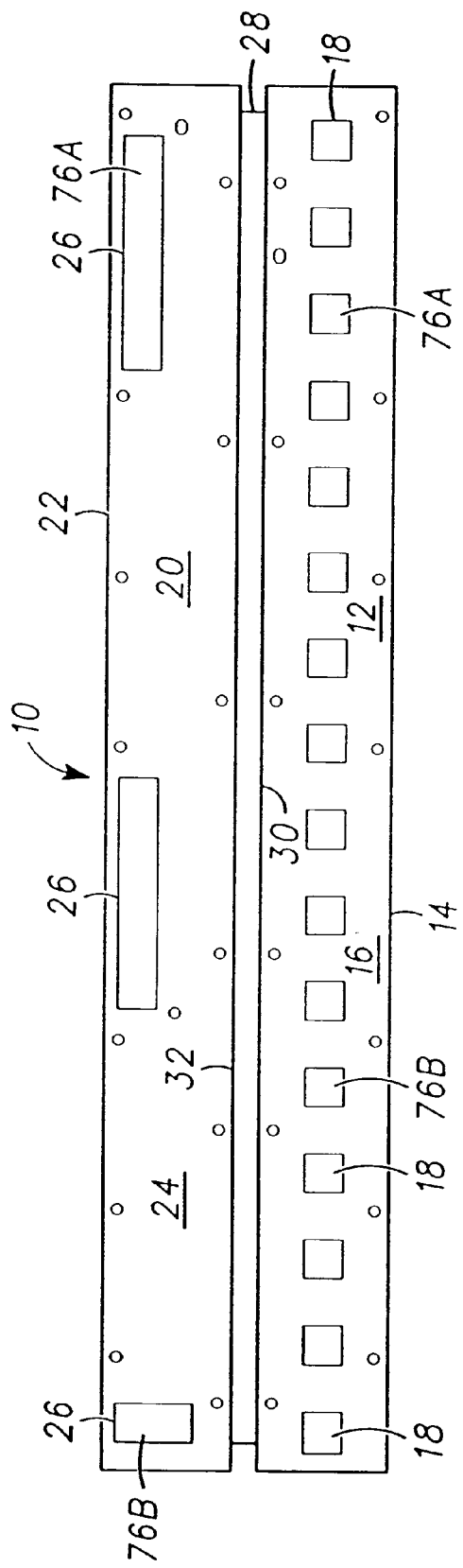
FIG. 1 is a front elevational view of a backplane according to the preferred embodiment of the present invention illustrating the backplane in a first position in which a first circuit board and a second circuit board are generally coplanar.
Figure 2:
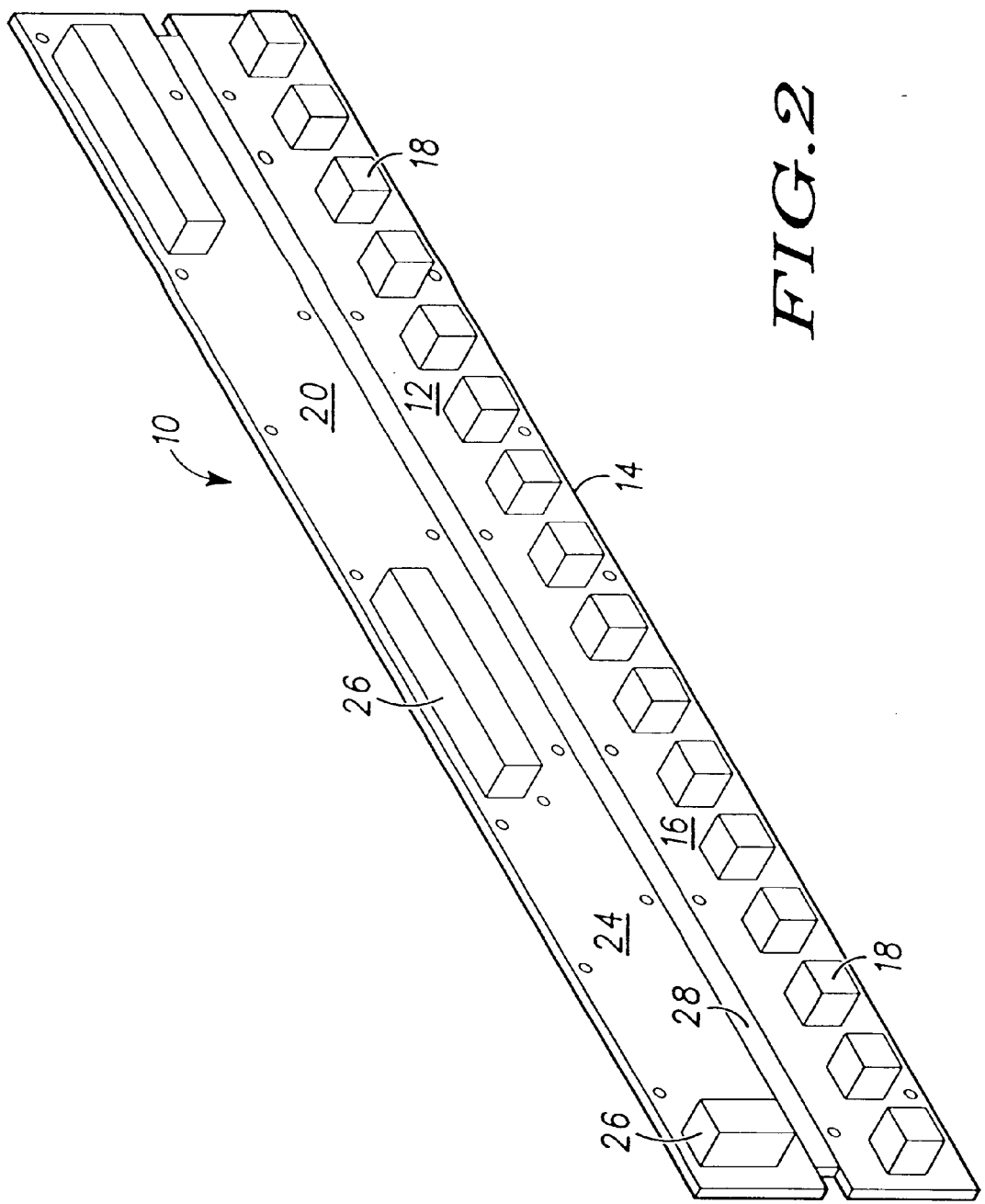
FIG. 2 is a front perspective view of the backplane of FIG. 1.

The ensuing detailed description provides a preferred exemplary embodiment only, and is not intended to limit the scope, applicability, or configuration of the invention. Rather, the detailed description of the preferred exemplary embodiment will provide those skilled in the art with an enabling description for making and using a preferred exemplary embodiment of the invention. It is understood that various changes may be made in the function and arrangement of elements without departing from the spirit and scope of the invention as set forth in the appended claims.

Referring to the drawings, wherein like numerals indicate like elements throughout, there is shown in FIGS. 1–4 a preferred embodiment of a backplane, generally designated 10. The backplane 10 of the present invention is operational in multiple positions which allows the backplane 10 to be used with a variety of electronic housings and allows for increased packaging density within the interior of an electronic housing.

The backplane 10 is capable of receiving plug-in modules and provides a first-module-receiving-location 76A and a second-module-receiving-location 76B. The first and second module-receiving-locations 76A, 76B are preferably formed by either a first or second electrical connector 18, 26 (further described below). The backplane 10 preferably includes a first circuit board 12 having a first perimeter 14 defining a first plane 16 and includes at least a first electrical connector 18. The first circuit board 12 is preferably formed of a rigid, heat resistant material. For example, the first circuit board 12 can be formed of plastic or phenolic material with printed circuits located thereon.

The first circuit board 12 preferably has a generally rectangular shape with first electrical plug-in connectors 18 disposed along one side. The first electrical connector 18 can be any suitable type of single or multi-channel connector adapted to electrically connect a plug-in module to the first circuit board 12 without departing from the scope of the present invention. Additionally, the first connectors 18 can be different from each other without departing from the present invention.

A second circuit board 20 has a second perimeter 22 defining a second plane 24 and includes at least a second electrical plug-in connector 26. The second circuit board 20 is preferably formed in the same manner as the first circuit board 12. The second electrical connector 26 can be of any suitable type of single or multi-channel connector adapted to electrically connect a plug-in module to the second circuit board 20, and can vary in size or type without departing from the scope of the present invention.

A flexible member 28 preferably connects the first circuit board 12 to the second circuit board 20 and establishes electrical communication therebetween. It is preferred that the first circuit board 12 and second circuit board 20 be connected by a flexible printed circuit member 28. However, the first circuit board 12 and the second circuit board 20 can be interconnected by wires or rigid conductors or the like without departing from the scope of the present invention. Those of ordinary skill in the art will appreciate from this disclosure that the first circuit board 12, the second circuit board 20, and the flexible member 28 can be formed as one piece and include a printed circuit thereon without departing from the scope of the present invention.

The flexible member 28 is preferably attached along an edge 30 of the first perimeter 14 of the first circuit board 12 and is preferably attached along an edge 32 of the second perimeter 22 of the second circuit board 20. While the flexible member 28 is shown as a single continuous member extending between the first and second circuit boards 12, 20, those of ordinary skill in the art will appreciate from this disclosure that the flexible member 28 can be formed of multiple, flexible, discrete segments of flexible material which connect the first and second circuit boards 12, 20 without departing from the scope of the present invention. Those of ordinary skill in the art will also appreciate from this disclosure, that the strength and flexibility of the flexible member 28 can be selected based upon an anticipated use of the backplane 10 without departing from the present invention. For example, a flexible member 28 having sufficient strength can be used to support the second circuit board 20 above the first circuit board 12 while only the first circuit board 12 is attached to the chassis 36.

The backplane 10 is operational in a first position (shown in FIGS. 1 and 2), in which the first circuit board 12 is positioned so that the first plane 16 is generally coplanar with second plane 24. Those of ordinary skill in the art will appreciate from this disclosure that the first circuit board 12 is generally co-planar with the second circuit board 20 when the second plane 24 is askew from the first plane 16 by approximately ten (10) degrees or less.

Figure 3:
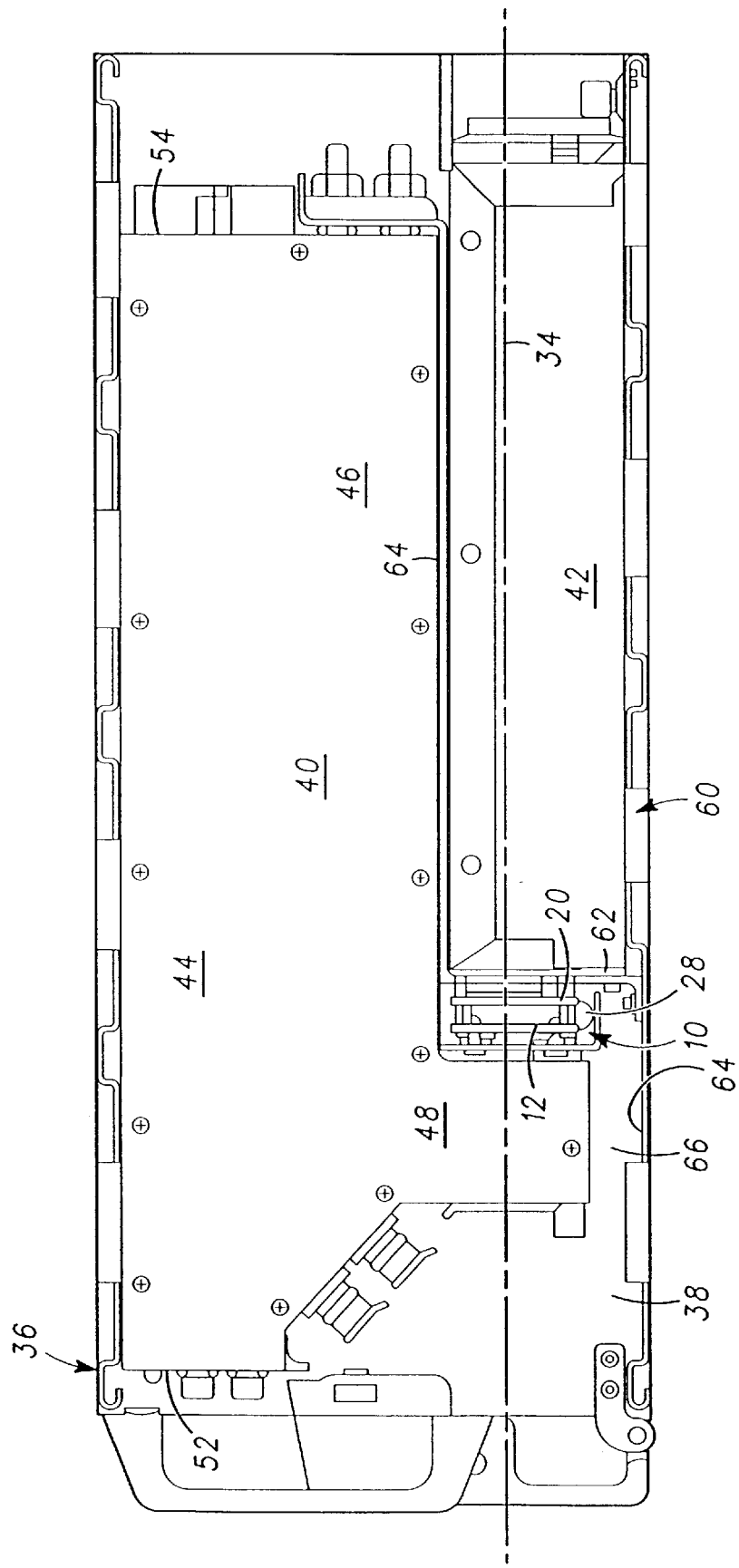
FIG. 3 is a cross-sectional view of an electronic chassis illustrating the backplane of FIG. 1 medially positioned within the electronic chassis, configured in a second position in which the first circuit board is spaced from and generally parallel to the second circuit board of the backplane, and engaged with a first and second plug-in module of the preferred embodiment of the present invention.
Figure 4:
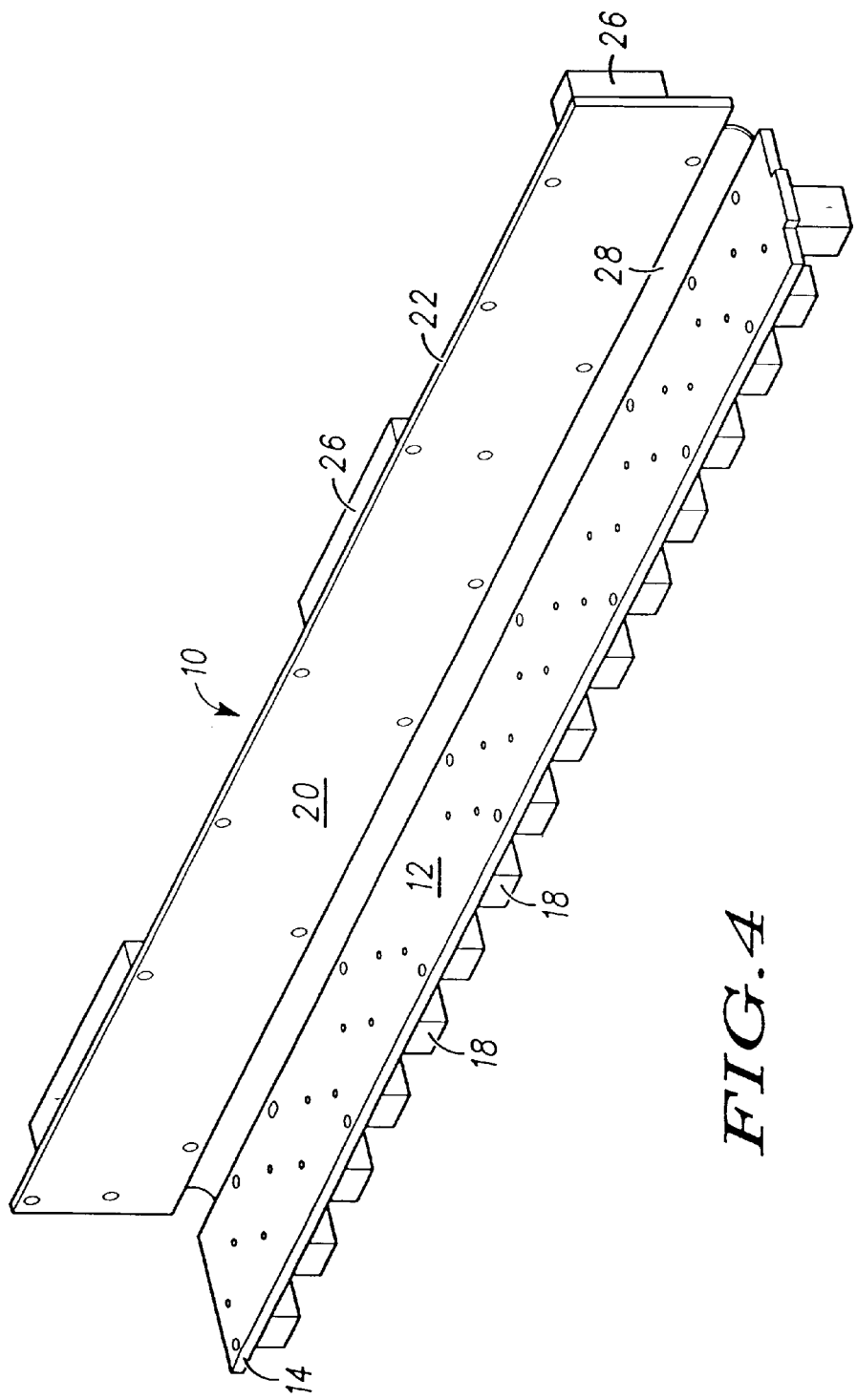
FIG. 4 is a rear perspective view of the backplane of FIG. 1 illustrating the backplane in a third position in which the first circuit board is located at an angle relative to the second circuit board.

As best shown in FIG. 3, the backplane 10 is also operational in a second position in which the first circuit board 12 is positioned so that the first plane 16 is spaced from and generally parallel to the second plane 24 and the first perimeter 14 extends over at least a portion of the second perimeter 24 when viewing the first circuit board 12 along an axis 34 generally perpendicular to the first circuit board 12. When the backplane 10 is in the second position, it is preferable that the first electrical connectors 18 extend from the first circuit board 12 in a first direction, generally away from the second circuit board 20, and the second electrical connectors 26 extend from the second circuit board 20 in a second direction, generally opposite from the first direction. When the backplane 10 is in the second position it is preferable that the flexible member is bent through an arc of between approximately one hundred sixty (160) degrees and approximately one hundred ninety-five (195) degrees. It is more preferable, but not necessary, that the flexible member be bent through an arc of approximately one hundred eighty (180) degrees.

The backplane 10 is preferably also operational while in a third position (shown in FIG. 4), in which the first circuit board 12 is positioned so that the first plane 16 is at an angle relative to the second plane 24. Thus, it is operable in any position between the first and second positions, where the flexible member is bent between approximately ten (10) degrees and approximately one hundred sixty (160) degrees.

Those of ordinary skill in the art will appreciate from this disclosure that the backplane 10 is not limited to the above-described preferred embodiment. For example, the backplane 10 may be a single circuit board, a single circuit board having opposing surfaces each having at least one surface mount assembly disposed thereon, two circuit boards pinned together, two circuit boards wired together, or a rigid-flex circuit board without departing from the scope of the present invention. Additionally, the first and second plug-in modules 40, 42 can be disposed on a single major surface of a single circuit board without departing from the scope of the present invention. For example, a single circuit board can be disposed adjacent a bottom side of the electronic chassis 36 and receive first and second plug-in modules 40, 42 along a single circuit board side at first and second module-receiving-locations 76A, 76B.

Figure 8:
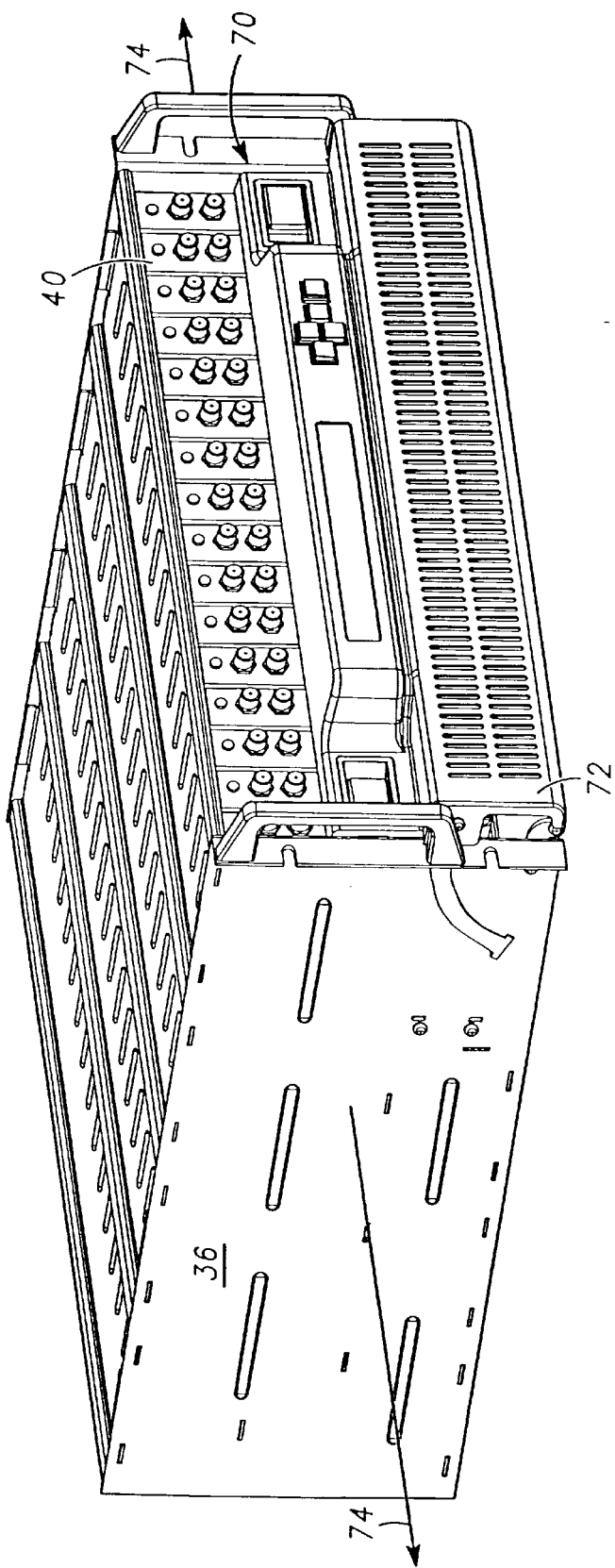
FIG. 8 is a front perspective view of the electronic chassis with a front cover in the closed position.
Figure 9:
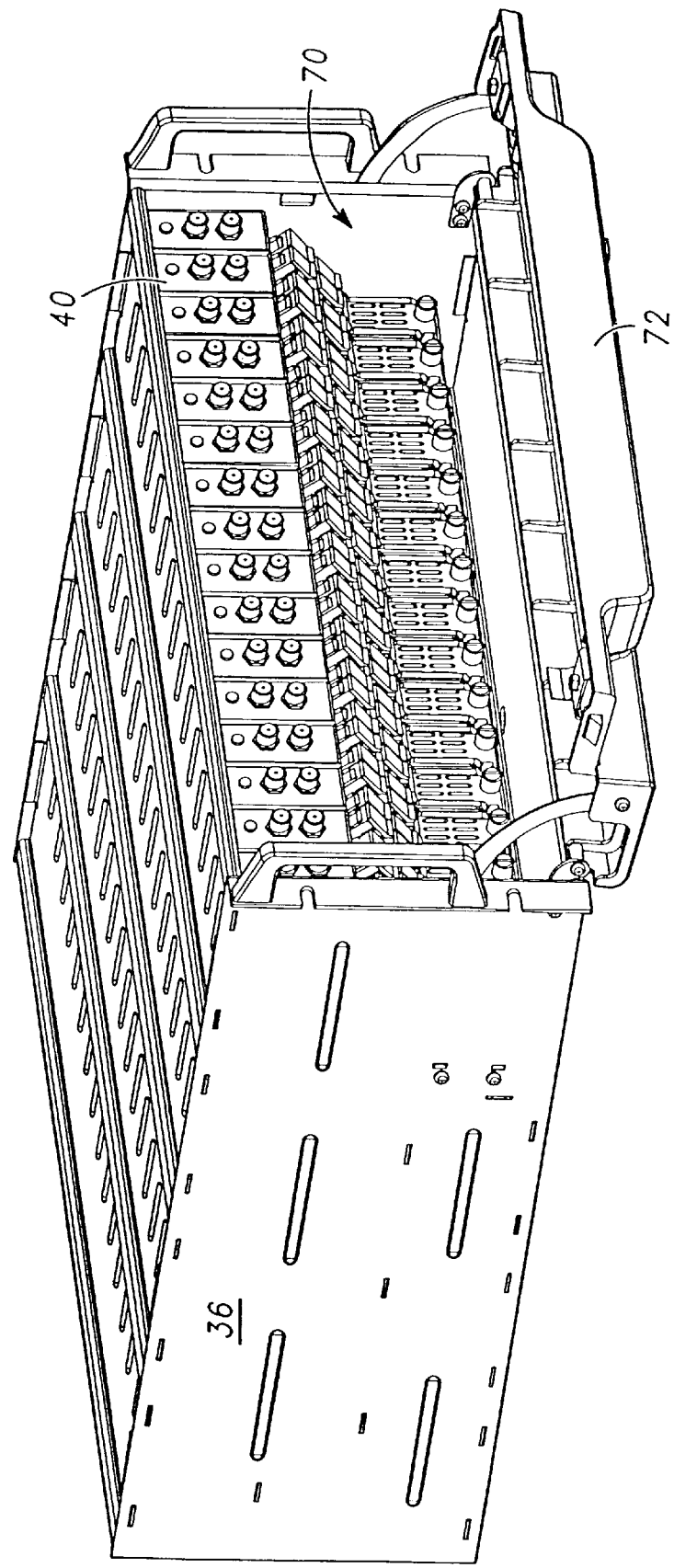
FIG. 9 is a front perspective view of the electronic chassis of FIG. 8 with the front cover in the open position.
Figure 10:
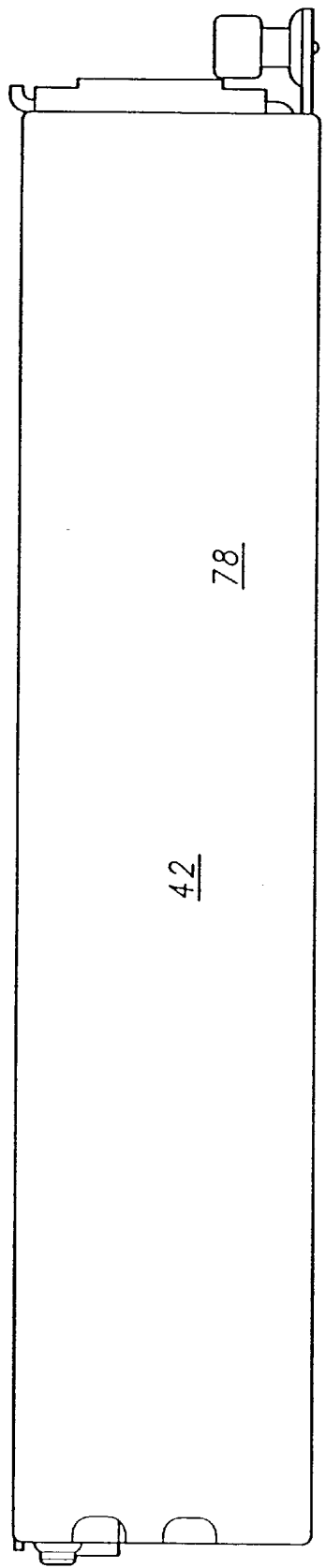
FIG. 10 is a right side elevational view of the second plug-in module shown in FIG. 3.

Referring to FIGS. 3, 8 and 9, preferably the backplane 10 is located in an electronics-rack-housing, or electronic chassis, 36 and is configured to receive plug-in modules 40, 42. It is preferred, but not necessary, that the electronic chassis 36 substantially enclose the first and second plug-in modules 40, 42. It is preferred that the electronics-rack-housing 36, the first plug-in module 40, and the second plug-in module 42 are formed of a strong durable material, such as steel, aluminum, a suitable polymeric material or the like. The electronic chassis 36 preferably has a generally rectilinear interior 38. As shown in FIG. 3, the backplane 10 is preferably medially positioned in the interior 38. The first and second plug-in modules 40, 42 are each detachably engageable with either of the first-module-receiving-location 76A and the second-module-receiving-location 76B. First and second plug-in modules 40, 42 are preferably attached to the backplane 10 via the connectors 18, 26 on the first and second circuit boards 12, 20.

Referring to FIGS. 3 and 5–7, the first plug-in module 40 preferably has an L-shape and is preferably engageable with the first electrical connector 18. The first plug-in module 40 includes a housing 44 with a first-elongated-housing-portion 46 and a second-housing-portion 48.

Figure 5:
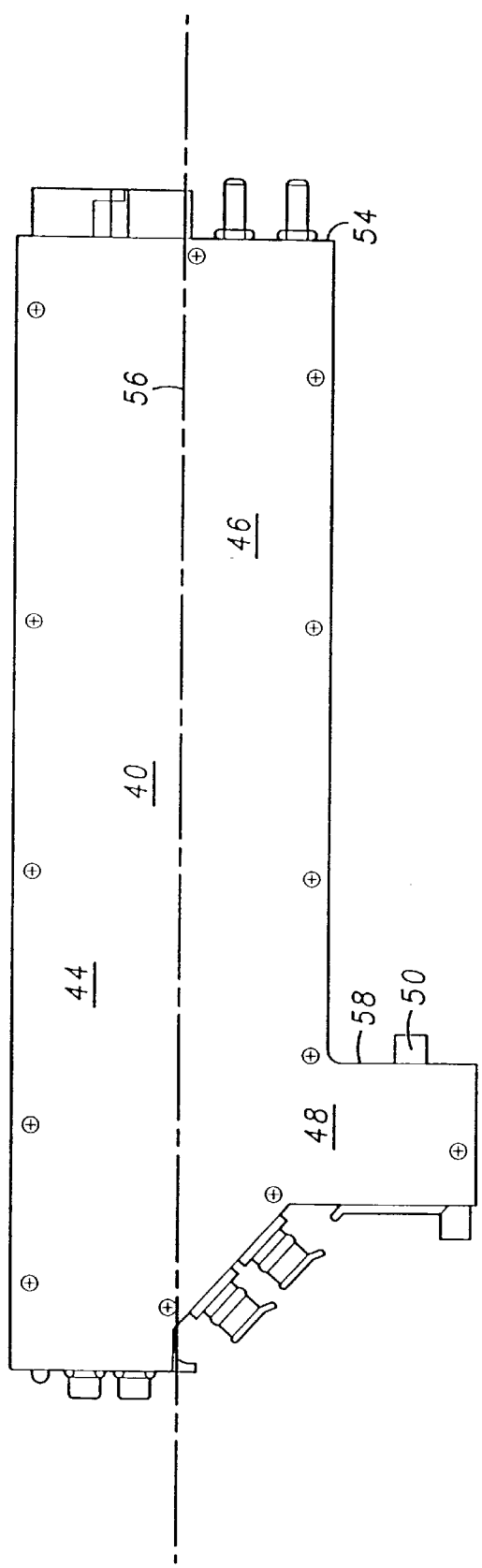
FIG. 5 is a right side elevational view of the first plug-in module shown in FIG. 3.
Figure 6:
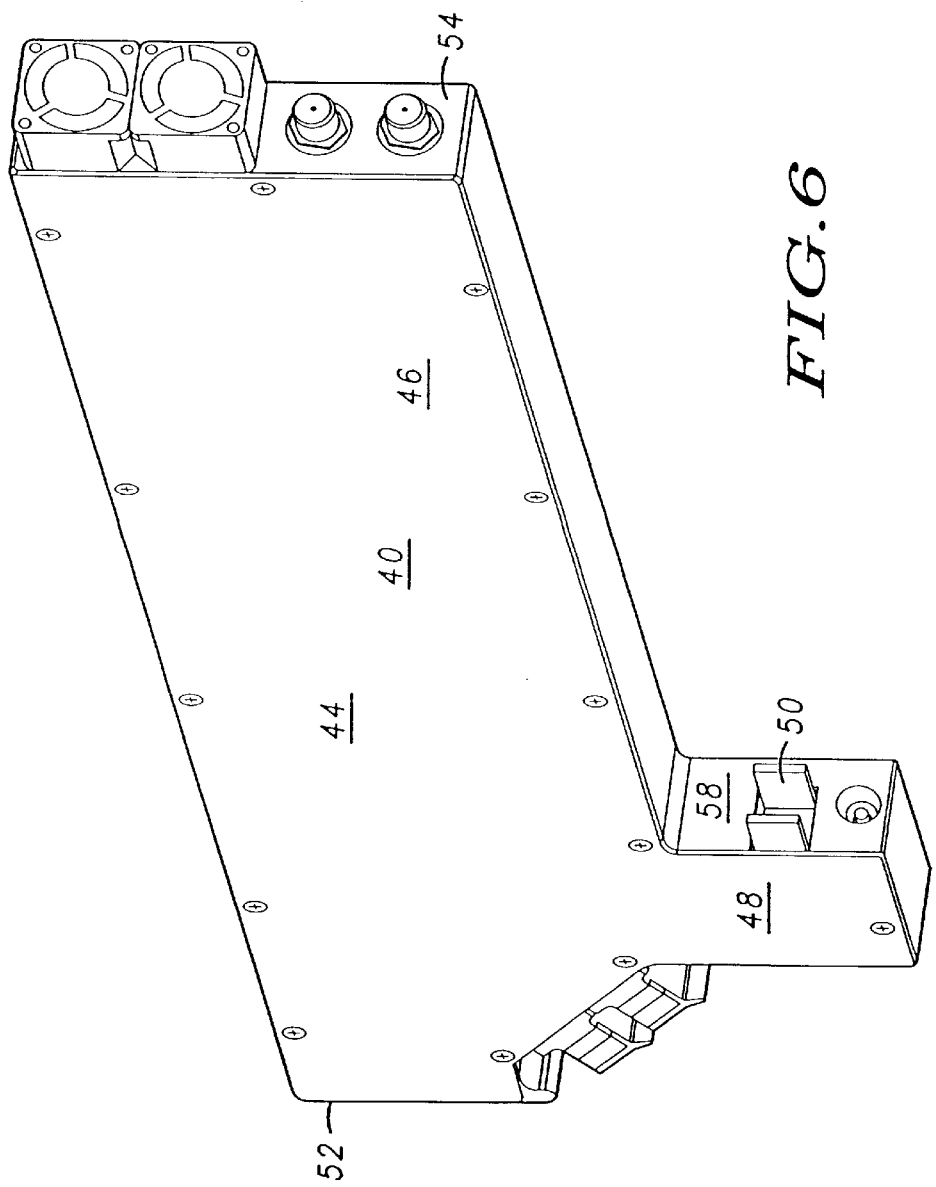
FIG. 6 is a rear perspective view of the first plug-in module shown in FIG. 5.
Figure 7:
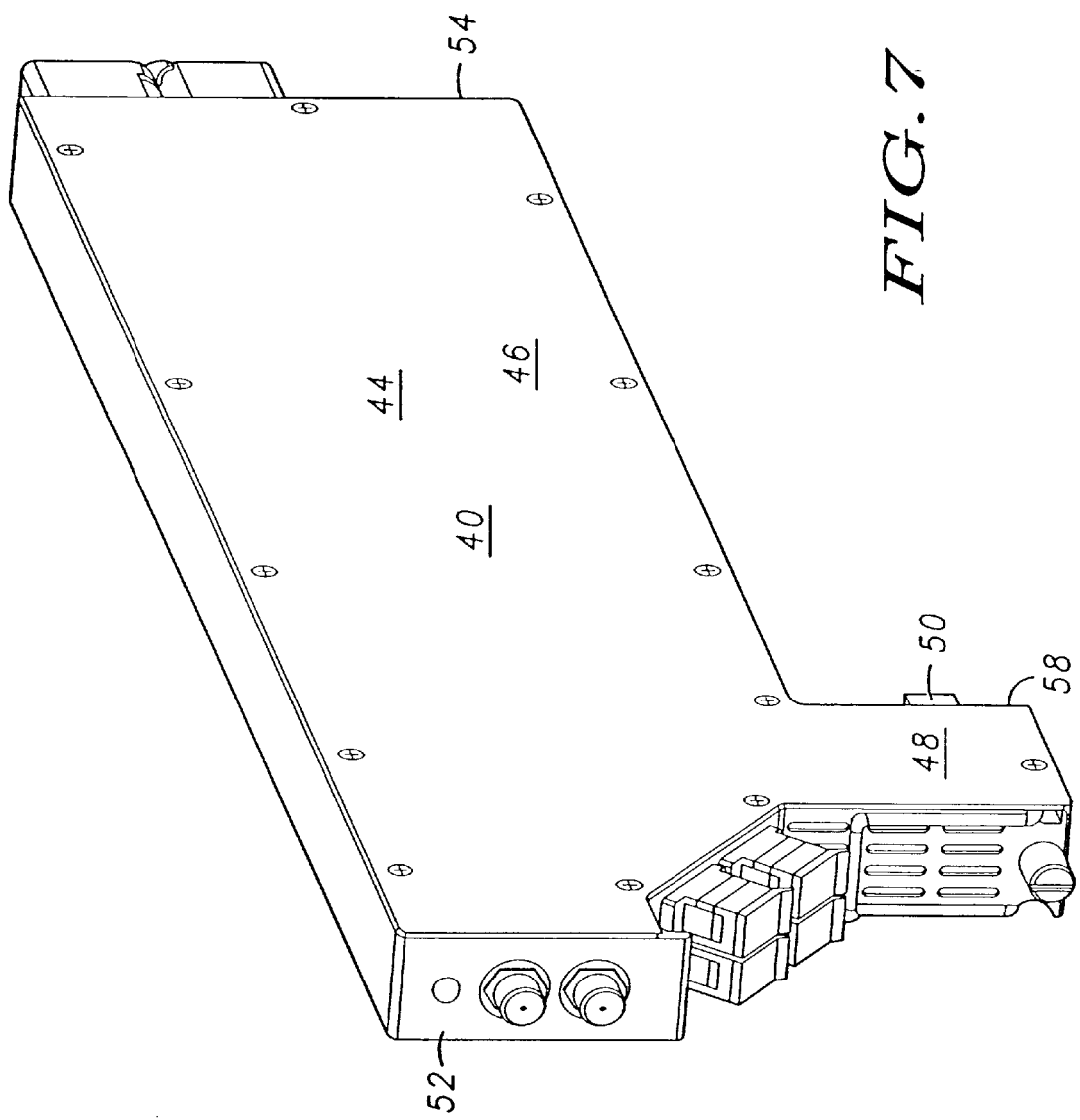
FIG. 7 is a front perspective view of the first plug-in module shown in FIG. 5.

The housing 44 of the first plug-in module 40 preferably has a first-elongated-housing-portion 46 with a first end 52, a second end 54, and a longitudinal axis 56 (shown in FIG. 5). The first-elongated-housing-portion 46 generally has the shape of a rectangular box. However, those of ordinary skill in the art will appreciate from this disclosure that the shape of the first-elongated-housing-portion 46 can be varied without departing from the scope of the present invention. The housing 44 of the first plug-in module 40 preferably has a second-housing-portion 48 extending from the first-elongated-housing-portion 46 disposed proximate to the first end 52 of the first-elongated-housing-portion 46. It is preferable that the second-housing-portion 48 be spaced from the first end 52 of the first-elongated-housing-portion 46.

The second-housing-portion 48 preferably has a connector surface 58 oriented generally perpendicular to the longitudinal axis 56 and facing generally toward the second end 54 of first-elongated-housing-portion 46 of the first plug-in module 40. A backplane connector 50 is preferably disposed on the connector surface 58 of the second-housing-portion 48. The backplane connector 50 is preferably engageable with the first electrical connector 18 of the backplane 10 to electrically connect the first plug-in module 40 to the backplane 10.

Figure 11:
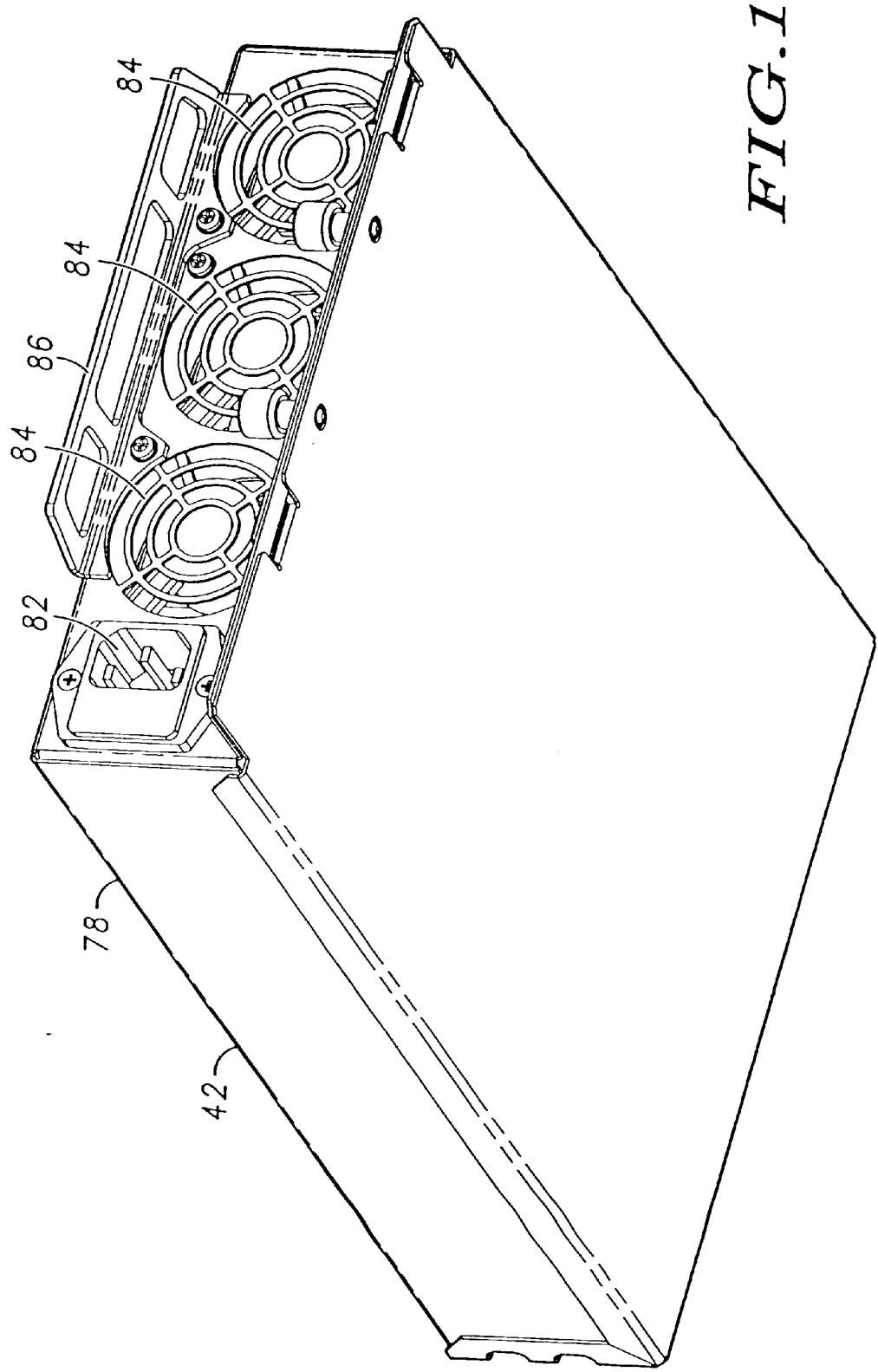
FIG. 11 is a front perspective view of the second plug-in module shown in FIG. 10.

Referring to FIGS. 3 and 10–12, the second plug-in module 42 preferably has a generally rectilinear shaped housing 78. As best shown in FIG. 12, the rear of the second plug-in module 42 preferably, but not necessarily, includes a female electrical connector 80 for receiving one of the backplane electrical connectors 18 or 26. As best shown in FIG. 11, in the preferred embodiment, the second plug-in module 42 is a power supply having an electrical connector 82 for connection to a power cable and having cooling fans 84. A handle 86 may optionally be disposed on the front of the second plug-in module 42 to facilitate removal and insertion of the second plug-in module 42.

Referring to FIGS. 3 and 8, a chassis axis 74 extends normal to the major surface of the first and second plug-in modules 40, 42. It is preferred that when the first and second plug-in modules 40, 42 are viewed along the chassis axis 74, the first and second plug-in modules 40, 42 substantially fill a cross-sectional area defined by the electronic chassis 36. Those of ordinary skill in the art will appreciate that the cross-sectional area is substantially filled when at least seventy-five (75) percent of the cross-sectional area defined by the electronic chassis 36 is occupied by the first and second plug-in modules 40, 42. It is preferable, but not necessary, that the first and second plug-in modules 40, 42 substantially fill at least eighty-five (85) percent of the cross-sectional area defined by the electronic chassis 36. It is further preferable that the first and second plug-in modules 40, 42 substantially fill at least ninety-five (95) percent of the cross-sectional area defined by the electronic chassis. Additionally, it is preferred, but not necessary, that the first plug-in module 40 have a first width (as measured along the chassis axis 74) and that the second plug-in module 42 have a second width (as also measured along the chassis axis 74) that is different from the first width. By allowing modules of different widths to be used, a designer is can package more of one type of module than another, depending on the anticipated use of the nested modules. For example, a designer may desire that sixteen (16) application modules be used with two (2) power supply modules. Modules of differing widths can be positioned along opposing sides of the backplane 10 or along the same side of the backplane 10 without departing from the scope of the present invention.

When the backplane connector 50 of the second-housing-portion 48 of the first plug-in module 40 is engaged with the first electrical connector 18 of the backplane 10, the first-elongated-housing-portion 46 extends beyond the backplane 10 and past the second circuit board 20 as shown in FIG. 3. This leaves a space 60 within the electronics housing 36 which occupies at least a portion of the same plane as the first plug-in module 40 and which can receive a smaller, second plug-in module 42, as shown in FIG. 3. However, if desired, the second plug-in module 42 can be wider than the first plug-in module 40 as is evident from a comparison of FIGS. 6 and 11. The second plug-in module 42 is engaged with at least one of the second electrical connectors 26 and is configured to occupy at least a portion of the space 60 defined on a first side 62 (the first side extending generally vertically as viewed in FIG. 3) by the second circuit board 20 and defined on a second side 64 (the second side extends generally horizontally as viewed in FIG. 3) by a portion of the first-elongated-housing-portion 46 of the first plug-in module 40 that extends past the second electrical connector 26.

It is preferable, but not necessary, that the second-housing-portion 48 of the first plug-in module 40 be positioned to form, in combination with a side 64 of the interior 38 of the electronic housing or chassis 36, a channel 66 between the first plug-in module 40 and the side 64 of the interior 38 to allow airflow between the backplane 10 and the atmosphere outside the electronic chassis 36.

Referring to FIGS. 8 and 9, an electronic chassis 36 capable of housing a plurality of modules 40, 42 is provided 10. The chassis 36 preferably includes at least one front or side opening 70 to access one of the first plug-in module 40 and the second plug-in module 42. In the embodiment of the present invention shown in FIG. 3 it is preferable to have at least one opening 70 along each of the front and rear sides of the chassis.

Referring to FIG. 8, a door 72 is shown in the closed position. Referring to FIG. 9, the door 72 is rotated outwardly to provide access to additional connectors on the plug-in modules. Those of ordinary skill in the art will appreciate from this disclosure that the present invention can include multiple doors and openings positioned on any side of the electronic chassis 36.

While the principles of the invention have been described above in connection with specific apparatus, it is to be clearly understood that this description is made only by way of example and not as a limitation on the scope of the invention.

What is claimed is:

1. A modular electronic chassis system with rack mounted electronic modules, comprising:

at least one circuit board defining first and second surface portions;

a first electrical connector disposed on the first surface portion of the at least one circuit board and defining a first-module-receiving-location;

a second electrical connector disposed on the second surface portion of the at least one circuit board and defining a second-module-receiving-location;

a first plug-in module having a housing with a first-elongated-housing-portion and a second-housing-portion, the second-housing-portion being detachably engaged with the first-module-receiving-location of the at least one circuit board; and a second plug-in module being detachably engaged with the second-module-receiving-location of the at least one circuit board and configured to occupy at least a portion of a space defined on a first side by at least a part of the second-housing-portion and defined on a second side by at least a part of the first-elongated-housing-portion of the first plug-in module, wherein the first plug-in module and the second plug-in module are nested.

2. The system of claim 1, further comprising an electronic chassis substantially enclosing the first and second plug-in modules.

3. The system of claim 2, wherein when the first and second plug-in modules are viewed along a chassis axis, the first and second plug-in modules substantially fill a cross-sectional area defined by the electronic chassis.

4. The system of claim 3, wherein when the first and second plug-in modules are viewed along the chassis axis, the first and second plug-in modules substantially fill at least seventy-five (75) percent of the cross-sectional area defined by the electronic chassis.

5. The system of claim 3, wherein when the first and second plug-in modules are viewed along the chassis axis, the first and second plug-in modules substantially fill at least eighty-five (85) percent of the cross-sectional area defined by the electronic chassis.

6. The system of claim 3, wherein when the first and second plug-in modules are viewed along the chassis axis, the first and second plug-in modules substantially fill at least ninety-five (95) percent of the cross-sectional area defined by the electronic chassis.

7. The system of claim 3, wherein the chassis includes at least front and side openings to access any one of the first plug-in module and the second plug-in module.

8. The system of claim 1, wherein the first plug-in module has a first width, as measured along a chassis axis, and the second plug-in module has a second width, as measured along the chassis axis, different from the first width.

9. The system of claim 1, wherein the at least one circuit board comprises a single circuit board.

10. The system of claim 9, wherein the single circuit board has opposing major surfaces each having at least one surface mount assembly disposed thereon.

11. The system of claim 1, wherein the at least one circuit board comprises two circuit boards pinned together.

12. The system of claim 1, wherein the at least one circuit board comprises two circuit boards wired together.

13. The system of claim 1, wherein the at least one circuit board comprises a rigid flex circuit board.

14. The system of claim 1, wherein the first plug-in module and the second plug-in module are disposed on a single major surface of a single circuit board.

15. The system of claim 14, further comprising an electronic chassis substantially enclosing the first and second plug-in modules, wherein the single circuit board is disposed adjacent a side of the electronic chassis.

16. The system of claim 1, wherein the first-elongated-housing-portion has a first end, a second end, and a longitudinal axis, the second-housing-portion extending from the first-elongated-housing-portion generally perpendicularly to the longitudinal axis, the second-housing-portion disposed proximate to the first end of the first-elongated-housing-portion and having a connector surface oriented generally perpendicular to the longitudinal axis and facing generally toward the second end of the fret-elongated-housing-portion, the second-housing-portion having a backplane connector disposed on the connector surface.

17. The system of claim 16, wherein the second-housing-portion is spaced from the first end of the first-elongated-housing-portion.

18. A modular electronic chassis system with rack mounted electronic modules, comprising:
at least one circuit board defining first and second surface portions;
a first electrical connector disposed on the first surface portion of the at least one circuit board and defining a first-module-receiving-location;
a second electrical connector disposed on the second surface portion of the at least one circuit board and defining a second-module-receiving-location;
a first plug-in module having a housing with a first-elongated-housing-portion and a second-housing-portion, the second-housing-portion being detachably engaged with the first-module-receiving-location of the at least one circuit board; and
a second plug-in module being detachably engaged with the second-module-receiving-location of the at least one circuit board and configured to occupy at least a portion of a space defined on a first side by at least a part of the second-housing-portion and defined on a second side by at least a part of the first-elongated-housing-portion of the first plug-in module, wherein the first plug-in module and the second plug-in module are nested; and
an electronic chassis substantially enclosing the first and second plug-in modules, wherein the electronic chassis includes a generally rectilinear interior, wherein the at least one circuit board is medially positioned in the interior and the first plug-in module and the second plug-in module are attached to the at least one circuit board the second-housing-portion of the first plug-in module being positioned to form, in combination with a side of the interior of the electronic chassis, a channel between the first plug-in module and the side of the interior to allow air flow between the at least one circuit board and outside the electronic chassis.

19. A modular electronic chassis system with rack mounted electronic modules, comprising:
at least one circuit board comprising first and second circuit boards with a flexible member extending therebetween to establish electrical communication between the first and second circuit boards, wherein the first circuit board defines a first surface portion and the second circuit board defines a second surface portion;
a first electrical connector disposed on the first surface portion of the at least one circuit board and defining a first-module-receiving-location;
a second electrical connector disposed on the second surface portion of the at least one circuit board and defining a second-module-receiving-location;
a first plug-in module having a housing with a first-elongated-housing-portion and a second-housing-portion, the second-housing-portion being detachably engaged with the first-module-receiving-location of the at least one circuit board; and
a second plug-in module being detachably engaged with the second-module-receiving-location of the at least one circuit board and configured to occupy at least a portion of a space defined on a first side by at least a part of the second-housing-portion and defined on a second side by at least a part of the first-elongated-housing-portion of the first plug-in module, wherein the first plug-in module and the second plug-in module are nested.

20. The system of claim 19, wherein the flexible member is attached to an edge of a first perimeter of the first circuit board and is attached to an edge of a second perimeter of the second circuit board.

21. The system of claim 20 wherein the flexible member is bent through an arc between approximately one hundred sixty (160) degrees and one hundred eighty-five (185) degrees.

22. The system of claim 21 wherein the flexible member is bent through an arc of approximately one hundred eighty (180) degrees.

23. The system of claim 22, wherein a first electrical connector extends from the first circuit board in a first direction, generally away from the second circuit board, and a second electrical connector extends from the second circuit board in a second direction, generally opposite from the first direction.

24. The system of claim 23, wherein the wherein first plug-in module is engaged with the first electrical connector and has an L-shape; and the second plug-in module is engaged with the second electrical connector and has a rectilinear shape.

25. A modular electronic chassis system with rack mounted electronic modules, comprising:

at least one circuit board defines first and second surface portions;

a first electrical connector disposed on the first surface portion of the at least one circuit board and defining a first-module-receiving-location;

a second electrical connector disposed on the second surface portion of the at least one circuit board and defining a second-module-receiving-location;

a first plug-in module having a housing with a first-elongated-housing-portion and a second-housing-portion, the second-housing-portion being detachably engaged with the first-module-receiving-location of the at least one circuit board;

a second plug-in module being detachably engaged with the second-module-receiving-location of the at least one circuit board and configured to occupy at least a portion of a space defined on a first side by at least a part of the second-housing-portion and defined on a second side by at least a part of the first-elongated-housing-portion of the first plug-in module, wherein the first plug-in module and the second plug-in module are nested; and an electronic chassis substantially enclosing the first and second plug-in modules, wherein the second-housing-portion of the first plug-in module forms, in combination with the electronic chassis, a channel to allow air to flow between outside the electronic chassis and the backplane.

\* \* \* \* \*

UNITED STATES PATENT AND TRADEMARK OFFICE
CERTIFICATE OF CORRECTION

PATENT NO. : 6,700,797 B2
DATED : March 2, 2004
INVENTOR(S) : Frederick et al.

It is certified that error appears in the above-identified patent and that said Letters Patent is hereby corrected as shown below:

Column 7,
Line 55, after the second instance of the word "the", delete "fret-elongated-housing-portion" and insert therefor -- first-elongated-housing-portion --.

Signed and Sealed this

Tenth Day of August, 2004

JON W. DUDAS
*Acting Director of the United States Patent and Trademark Office*